(12) United States Patent
Frosien

(10) Patent No.: US 7,663,102 B2
(45) Date of Patent: Feb. 16, 2010

(54) HIGH CURRENT DENSITY PARTICLE BEAM SYSTEM

(75) Inventor: Juergen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 258 days.

(21) Appl. No.: 10/593,246

(22) PCT Filed: Feb. 17, 2005

(86) PCT No.: PCT/EP2005/001637

§ 371 (c)(1),
(2), (4) Date: Jul. 17, 2007

(87) PCT Pub. No.: WO2005/096343

PCT Pub. Date: Oct. 13, 2005

(65) Prior Publication Data

US 2007/0284536 A1 Dec. 13, 2007

(30) Foreign Application Priority Data

Mar. 19, 2004 (EP) .................................. 04006692

(51) Int. Cl.
*H01J 37/09* (2006.01)
(52) U.S. Cl. .................... 250/310; 250/311; 250/396 R; 250/492.1; 250/492.3; 250/505.1; 850/9; 850/63
(58) Field of Classification Search ............. 250/396 R, 250/396 ML, 306, 307, 309, 310, 311, 492.1, 250/492.36, 505.1, 515.1, 492.2, 492.3; 850/9, 850/63
See application file for complete search history.

(56) References Cited

U.S. PATENT DOCUMENTS

| 3,996,468 | A | * | 12/1976 | Fletcher et al. | ......... | 250/396 R |
| 4,209,698 | A | * | 6/1980 | Hoppe | ........................ | 250/311 |
| 4,524,278 | A | * | 6/1985 | Le Poole | .................... | 250/398 |
| 4,982,099 | A |   | 1/1991 | Lischke | | |
| 5,834,783 | A | * | 11/1998 | Muraki et al. | ................ | 250/398 |
| 6,441,384 | B1 | * | 8/2002 | Kojima | .................. | 250/492.23 |
| 6,465,796 | B1 | * | 10/2002 | Haraguchi et al. | ..... | 250/492.23 |
| 6,563,125 | B1 | * | 5/2003 | Suzuki | .................. | 250/492.21 |
| 6,924,488 | B2 | * | 8/2005 | Matsuya et al. | ......... | 250/396 R |

(Continued)

FOREIGN PATENT DOCUMENTS

EP          0213664 A1     3/1987

(Continued)

OTHER PUBLICATIONS

International Search Report, PCT/EP/2005/001637, Feb. 17, 2005.

*Primary Examiner*—David A Vanore
*Assistant Examiner*—Michael J Logie
(74) *Attorney, Agent, or Firm*—Patterson & Sheridan, LLP

(57) ABSTRACT

The present invention relates to charged particle beam devices. The devices comprise an emitter for emitting charged particles; an aperture arrangement with at least two apertures for separating the emitted charged particles into at least two independent charged particle beams; and an objective lens for focusing the at least two independent charged particle beams, whereby the independent charged particle beams are focused onto the same location within the focal plane.

34 Claims, 8 Drawing Sheets

U.S. PATENT DOCUMENTS

| | | | |
|---|---|---|---|
| 6,943,349 B2 * | 9/2005 | Adamec et al. | 850/9 |
| 7,186,975 B2 * | 3/2007 | Ishitani et al. | 250/310 |
| 2002/0104970 A1 * | 8/2002 | Winter et al. | 250/400 |
| 2004/0144920 A1 * | 7/2004 | Lopez et al. | 250/305 |

FOREIGN PATENT DOCUMENTS

| | | |
|---|---|---|
| EP | 1150327 A1 | 10/2001 |
| EP | 1197985 A2 | 4/2002 |
| EP | 1463087 A1 | 9/2004 |

* cited by examiner

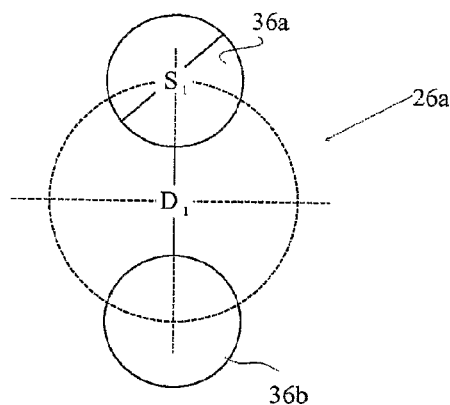
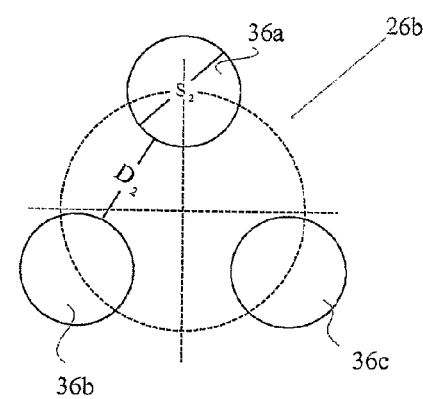
Fig. 3a                Fig. 3b
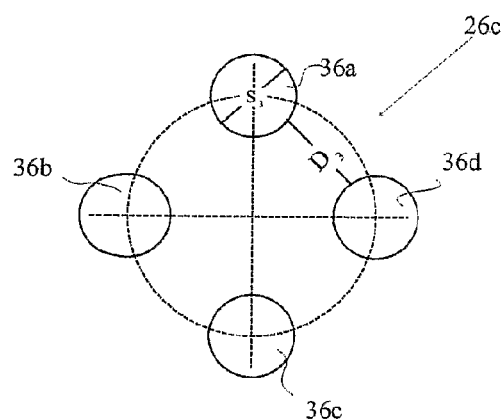
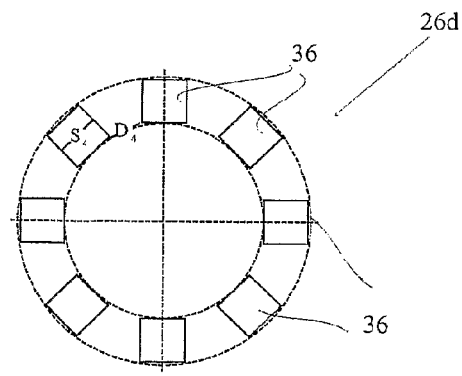
Fig. 3c                Fig. 3d

HIGH CURRENT DENSITY PARTICLE BEAM SYSTEM

FIELD OF THE INVENTION

The invention relates to charged particle beam devices for inspection system applications, testing system applications, lithography system applications and the like. It also relates to methods of operation thereof. Further, the present invention relates to high current density particle beam applications. Specifically, the present invention relates to charged particle beam devices and methods of using charged particle devices.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Besides resolution, throughput is an issue of such devices. Since large substrate areas have to be patterned or inspected, throughput of for example larger than 10 $cm^2$/min and, therefore, high probe currents in the range of 100 nA or higher, are desirable.

However, particle-particle interaction (Boersch effect) limits the resolution for high beam currents. Especially for low voltage applications, that are applications with the beam energy around or below 1 keV, particle interaction limits the resolution for high beam currents.

One approach for reducing the particle-particle interaction for a lithography systems was proposed by U.S. Pat. No. 6,635,891. Therein, a hollow-beam apparatus utilizing a ring aperture in a crossover is suggested.

However, the hollow beam is difficult to shape and the charged particle interaction might not be significantly reduced.

SUMMARY OF THE INVENTION

The present invention provides an improved charged particle system. Thereby, the particle-particle interaction is intended to be reduced. According to aspects of the present invention, a charged particle beam device according to independent claims 1, 5 and 8 and a method of operating a charged particle beam device according to independent claim 25 are provided.

Further advantages, features, aspects and details of the invention are evident from the dependent claims, the description and the accompanying drawings.

According to one aspect a charged particle beam device is provided. The device comprises: an emitter for emitting charged particles; an aperture arrangement with at least one aperture for blocking a part of the emitted charged particles, whereby the aperture arrangement forms a multi-area sub-beam charged particle beam with a cross-section-area and a cross-section-circumference, whereby a ratio between the cross-section-circumference and the cross-section-area is increased by at least 15% as compared to the ratio between a cross-section-circumference and a cross-section-area of a circular beam with the same cross-section-area as the multi-area sub-beam charged particle beam; an objective lens for focusing the multi-area sub-beam charged particle beam onto the same location within the focal plane.

According to another aspect a charged particle beam device is provided, whereby the device comprises: an emitter for emitting charged particles; an aperture arrangement with at least one aperture for blocking a part of the emitted charged particles, whereby the aperture arrangement forms a multi-area sub-beam charged particle beam with a cross-like shape; and an objective lens for focusing the at least two independent charged particle beams onto the same location within the focal plane.

According to a still further aspect, a charged particle beam device is provided. The device comprises an emitter for emitting charged particles; an aperture arrangement with at least two apertures for separating the emitted charged particles into at least two independent charged particle beams; and an objective lens for focusing the at least two independent charged particle beams, whereby the independent charged particle beams are focused onto the same location within the focal plane.

Thereby, each independent charged particle beam (bundle) can be interaction optimized and/or an interaction between the bundles can be avoided. Thus, the charged particle current density on a specimen can be increased, without too much drawback due to the Boersch-effect.

It may be understood that "focusing onto the same location within the focal plane" means to generate one continuous particle probe in the focal plane.

It has to be noted that, unlike many state of the art devices, according to an aspect of the present invention, no image of the aperture arrangement is generated on the specimen. The probe generated on the specimen is the image of a source, virtual source or a crossover. Thus, one charged particle spot is generated in the focal plane of the objective lens of the scanning type charged particle beam device.

According to a further aspect, the charged particle beam device is provided in form of a SEM. Typically, the invention is applied to high current (typically >=50 nA for 1 keV) SEMs.

Consequently, according to another aspect, the charged particle device further comprises a detector. As an example, this detector might be position above the objective lens.

As a further consequence, according to an even further aspect, the opening of the objective lens typically has a maximal diameter of 20 mm.

According to another aspect, a charged particle beam device is provided, whereby the at least two independent charged particle beams have a distance with respect to each other such that no interaction occurs between the at least two independent charged particle beams. Thereby, typically for a further aspect of the present invention, the at least two independent charged particle beams have a distance with respect to each other between ½ of the diameter of the at least two apertures and two times the diameter of the at least two apertures. Typically the distance and the diameter may be about the same size. This may absolutely be in the range of 5 to 100 µm.

Consequently, the apertures are formed and are positioned with respect to each other such that a bundle-interaction can be neglected or at least limited.

According to another aspect of the present invention, a charged particle beam device is provided, whereby the at least two apertures have an elongated shape with a long axis and short axis. Thereby, the long axis is arranged radially with respect to an optical axis of the charged particle beam device.

Thus, it is possible to realize the independent charged particle beams in a manner such that an optional aberration correction element can be provided, which can be more easily realized than state of the art aberration correction elements. Typically, according to an even further aspect, this aberration correction element is provided as a spherical aberration correction element, and even more typically, optionally, by an octopole element.

According to another aspect of the present invention, a charged particle beam device is provided, whereby the at least two apertures are arranged rotational-symmetrical to an optical axis of the charged particle beam device. And especially, according to yet another aspect, the aperture arrangement comprises four apertures.

With respect to the first of these aspects, a homogeneous (uniform) illumination of the aperture arrangement, which is a further optional aspect of the present invention, can be realized more easily. With respect to the second of these aspects, the above-mentioned aberration correction can advantageously be applied by providing four apertures. However, this condition is not obligatory for an inspection or measurement apparatus. For an inspection or measurement apparatus also a non-uniform illumination is possible.

According to a further aspect, if independent charged particle beams are formed the number of independent charged particle beams is smaller than 50, preferably smaller than 17 and even more preferably, smaller than 5.

According to an even further aspect, the charged particle beam device further comprises a scanning unit for scanning the charged particle beam over the specimen. Typically, according to another aspect, this scanning unit is positioned after the front focal plane of the objective lens. According to a further optional aspect this position would be around the center (in direction of the optical axis) of the objective lens.

Thereby, one alternative to provide the scanning unit is an electrostatic scanning unit, that is especially advantageous for high current applications. In the event of other applications also magnetic or electrostatic-magnetic scanning units may be used.

The above mentioned aspects can be combined with any other feature, aspect, detail, or combination of features, aspects and details, which promote the possibility to reduce particle-particle interaction effects for high current densities on a specimen.

According to another aspect of the present invention, a method of operating a charged particle beam device is provided. The method comprises the steps: illuminating an aperture arrangement having at least two apertures, whereby at least two independent charged particle beams are generated; and focusing the at least two independent charged particle beams with an objective lens onto the same location of a specimen.

According to yet another aspect, a method of operating a charged particle beam device is provided, whereby the at least two apertures are provided on a circle around an optical axis of the charged particle device. And according to another aspect, optionally, the method can be provided, whereby the aperture arrangement is illuminated such that the at least two apertures are homogeneously illuminated.

Thereby, similar imaging conditions for the independent charged particle beams can be realized. Consequently, aberration correction means, focusing means, and other means for guiding, shaping, or influencing the bundles can be applied similarly for all beam bundles.

Making use of the above aspects, it is possible, according to another aspect of the present invention, to include the step of interaction-optimizing each of the at least two independent charged particle beams.

According to another aspect of the present invention, a method of operating a charged particle beam device is provided, whereby the charged particles are energized to impinge on the specimen with an energy below 3 keV. Additionally, the step of correcting spherical aberrations, which are introduced by guiding the at least two independent charged particle beams off-axis, may be included.

According to another aspect, an image area of the specimen is imaged by scanning the charged particle probe over the specimen. Thereby, the objective lens is excited to generate a first focal length. Further, the image area is imaged at least a second time, whereby the objective lens is excited to generate at least a second focal length. The set of focus series measurements is superposed to create a 3-dimensional image.

This aspect may advantageously be applied with the independent beam bundles, since the relatively large objective angle results in a depth of focus.

The invention is also directed to apparatuses for carrying out the disclosed methods, including apparatus parts for performing each of the described method steps. These method steps may be performed by way of hardware components, a computer programmed by appropriate software, by any combination of the two, or in any other manner.

BRIEF DESCRIPTION OF THE DRAWINGS

Some of the above indicated and other more detailed aspects of the invention will be described in the following description and partially illustrated with reference to the figures. Therein:

FIGS. 3a to 3d schematically show aperture arrangements of embodiments of the present invention;

DETAILED DESCRIPTION OF THE DRAWINGS

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image.

Within the following description of the drawings, the same reference numbers refer to the same components. Generally, only the differences with respect to the individual embodiments are described.

Figure 1C:
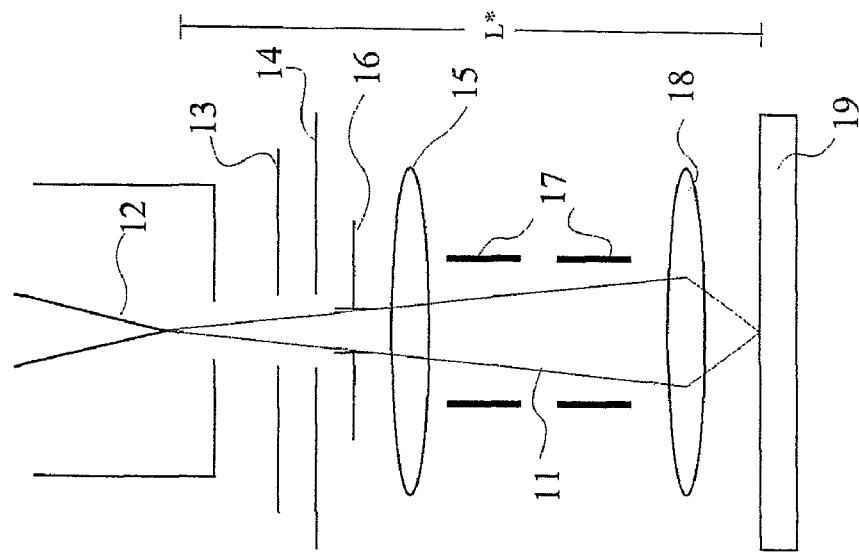
FIGS. 1a to 1c show schematic side views of three charged particle beam columns illustrating some effects relating to particle-particle interaction in charged particle beam columns.
Figure 1B:
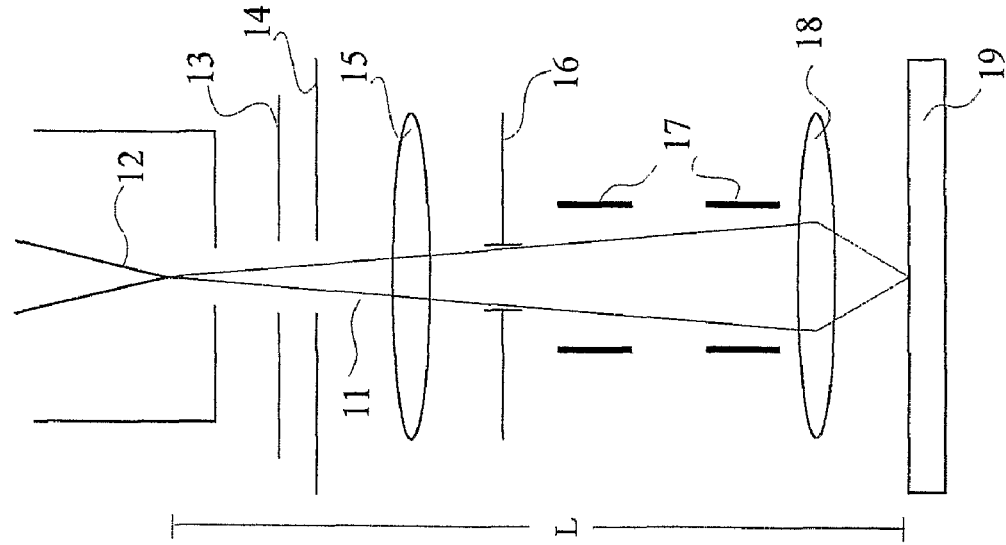
Figure 1A:
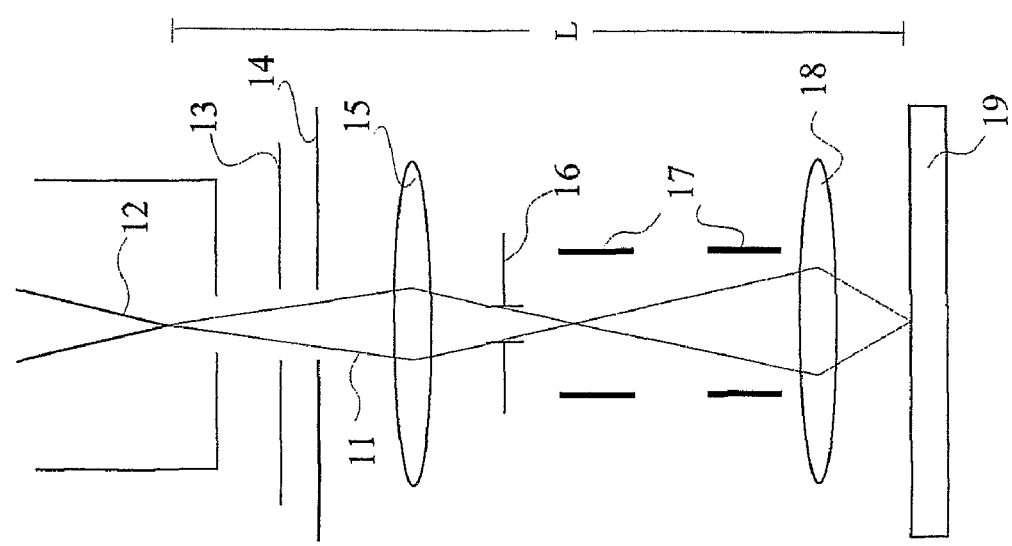

Within FIG. 1a an electron beam device is shown. Emitter 12 emits an electron beam 11 which is extracted by extractor 13 and accelerated by anode 14. Condenser lens 15 focuses electron beam 11. In the example shown in FIG. 1a, aperture 16 for shaping the electron beam is positioned above the crossover. The electron beam, which is focused on specimen 19 by objective lens 18, can be scanned over the specimen by scan deflectors 17.

Independent of specific embodiments, the objective lenses are typically provided in form of rotational symmetric objective lenses.

As denoted with reference sign "L", the embodiment shown in FIG. 1a has a predetermined distance between emitter 12 and specimen 19. Even though having the same distance L between the emitter and the specimen, FIG. 1b shows an embodiment with a first improvement. This embodiment avoids a crossover within the optical column of the charged particle device. Thereby, no intermediate image is generated.

Generally, within the crossover, additional energy width is created. This reduces the performance by increased chromatic aberration. Nevertheless, particle optical systems having a dominant interaction limitation might also tolerate a crossover mode.

Within the embodiment shown in FIG. 1c, firstly, a variety of measures are taken to reduce the interaction of the charged particles. These measures, even though combined within one embodiment, can also be individually used for reducing the particle-particle interaction.

Within FIG. 1c, the distance between the emitter and the specimen is reduced as indicated by L*. Thereby, the electron beam path, along which an electron-electron interaction can limit the resolution, is shortened. Further, the primary electron beam can be accelerated to a higher potential within the column and decelerated by a retarding lens or the like. Aperture 16, which shapes electron beam 11, is arranged closer to the emitter 12 as compared to the embodiments shown in FIGS. 1a and 1b. Since aperture 16 decreases the beam current by blocking parts of the emitted electrons, there is less particle interaction of the electron beam traveling through the column. By means of aperture 16, the size of the beam bundle can be optimized with respect to geometrical aberration and interaction limitation. Additionally, a plurality of columns of FIG. 1c can be arrayed. Thereby, the sum of the electron beam current can be increased since there is no interaction between electron beams of neighboring columns, which may further be shielded with respect to each other.

Figure 2:
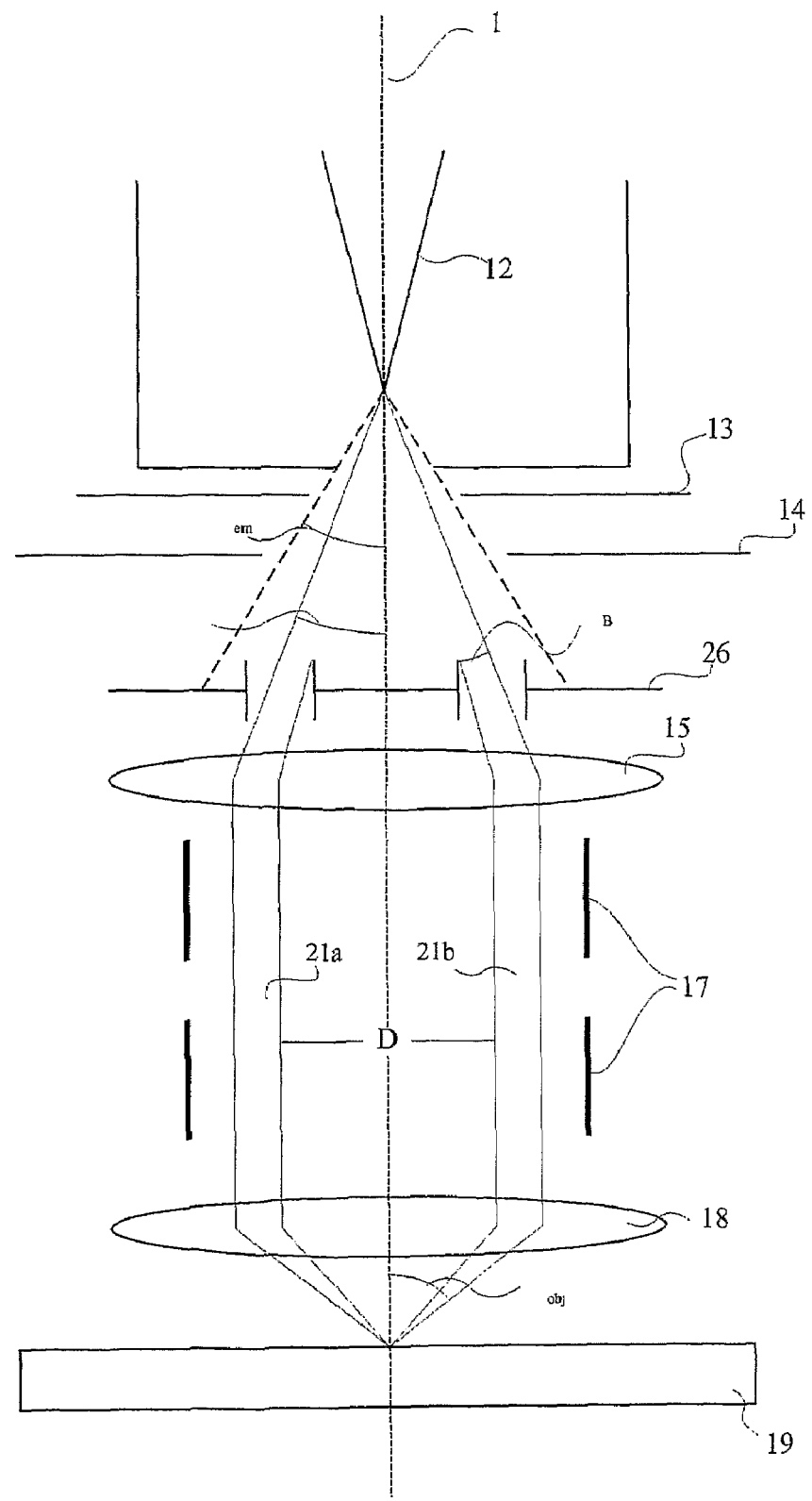
FIG. 2 shows a schematic side view of a charged particle beam device according to one embodiment of the present invention.

An embodiment according to the invention is shown in FIG. 2. Therein, an electron beam device with an optical axis 1 is shown. The electrons emitted by emitter 12 under emission angle $\alpha_{em}$ are extracted by extractor 13 and by anode 14. Aperture arrangement 26 blocks parts of the electrons, whereby a plurality of electron beams (beam bundles) are generated. These beam bundles travel separated from aperture arrangement 26 to specimen 19. Each of these beam bundles are independent electron beams. They are interaction limited and interaction optimized, respectively. However, the independent electron beams are separated from each other by a distance such that no interaction occurs between the individual electron beams.

The beam bundles (independent electron beams) travel independently through the optical system. Thereby, the electron beams indicated by reference numbers 21a and 21b in FIG. 2 pass through condenser lens 15 and scan deflectors 17 in order to be focused by objective lens 18 into a common probe on the specimen. The charged particle-beam bundles are focused onto the same location. The location may be defined as having a maximal dimension of 200 nm. Thus, objective lens 18 focuses the independent electron beams onto the same focal point in the focal plane.

Independent of specific embodiments, an aspect of the invention may generally be described as follows. Charged particles are emitted from a single emitter. Further, at least two independent beam bundles are generated from the charged particles emitted by the single emitter. The independent beam bundles are guided through the column substantially parallel and are focused by one objective lens into one charged particle probe.

Independent of specific embodiments described herein, the lenses and especially the objective lens may either be electrostatic, magnetic or compound electrostatic-magnetic. Thereby, also high precision lenses as described in European patent application No. 03025353.8 by Frosien may be used as one option.

As already described with respect to FIG. 1b, without being limited thereto, a beam path without a crossover can be considered advantageous. Since each of the electron beam bundles 21a and 21b is optimized with regard to the beam current, the electron current density on the specimen can be increased n-times by providing n electron beam bundles.

Thereby, aperture arrangement 26 is arranged close to the emitter so that a separation into independent electron beams takes place as soon as possible within the column. Within the embodiment shown in FIG. 2, the aperture arrangement and thereby the beam bundles are arranged symmetrically with respect to optical axis 1. Thus, the optical imaging characteristic of the electron beam column is similar for electron beam 21a and 21b.

However, generally, it has to be considered disadvantageous to provide an electron beam path with electron beams traveling significantly off-axis. Yet, the aperture arrangement 26 as shown in FIG. 2 has off-axial aperture locations. Thereby, spherical aberrations will be increased. Generally, the diameter of the electron probe can be described as:

$$D_{probe} = (D^2_{sperical} + D^2_{chromatic} + D^2_{interaction})^{1/2}$$

The spherical aberration depends on the third order of aperture angle $\alpha$.

$$D_{spercial} = C_s \alpha^3$$

Thus, providing off-axis beam bundles is contradictory to the general teaching of minimizing possible aberrations. However, the system as shown in FIG. 2 can be better described by:

$$D_{sperical\ enlargement} = 3C_s \alpha_B \alpha^2$$

whereby $\alpha$ is the angle between the center of the aperture and the optical axis. Thus, spherical aberrations increase merely with the second order of the angle between aperture and optical axis.

Especially for applications with high current density, which are interaction dominated anyway, spherical aberrations can be neglected up to a certain degree. Nevertheless, the distance D/2 of the electron bundle from optical axis 1 should be as small as possible without introducing any interaction between the independent electron beams. Typical design criteria could be that the aperture openings and the distances between the aperture are in the same order of magnitude.

Embodiments of aperture arrangements will now be described with respect to FIGS. 3a to 3d. Within FIG. 3a, two apertures 36a are arranged with the 2-fold symmetry around the optical axis. Thereby, the electron bundles have a distance $D_1$. The sizes of the apertures are indicated by reference sign $S_1$. The apertures are arranged on a virtual circle around optical axis 1. Within FIG. 3b, three apertures are arranged in 3-fold symmetry. By increasing the number of apertures, the distance between the electron beams is decreased unless the size of the apertures is reduced.

Thus, for the aperture arrangement 26b within FIG. 3b, the distance $D_2$ between the electron bundles is realized by having an aperture size $S_2$ which is smaller than aperture size $S_1$. The apertures 36 of aperture arrangement 26c shown in FIG. 3c are further reduced in size in order to realize distance $D_3$ between the electron beams. The four apertures in FIG. 3c are arranged in 4-fold symmetry around optical axis 1.

A further embodiment that differs from the above-mentioned embodiments is shown in FIG. 3d. Thereby, a ring is segmented to form apertures 36. Thereby, aperture arrangement 26d includes eight apertures with 8-fold symmetry around optical axis 1.

The above-described embodiments of FIGS. 3a to 3d are examples for aperture arrangements with different distances $D_1$ to $D_4$, whereby each distance is sufficiently large in order not to have any inter-bundle interaction. Nevertheless, aperture arrangements with different numbers of apertures can be realized. Further, the symmetrical formation around optical axis 1 is a typical arrangement having some advantages, which will be described in the following. However, the present invention is not limited thereto.

The symmetrical formation of the apertures can be considered advantageous with regard to the emission characteristics of the gun. Typical emission angles, e.g. from TFE, have a value of $\alpha_{emission}$=10-1 rad, which shows homogeneous current density. Accordingly, the apertures should be arranged within this emission angle to be illuminated homogeneously. This results in homogeneous current density of all electron beam bundles. Therefore, the above-mentioned symmetry may be considered advantageous in order to have the same illumination for all apertures.

Generally, without reference to any of the specific embodiments, the distance of the apertures from the optical axis should be as small as possible to keep the spherical aberration contribution as small as possible. However, the distance has to be made large enough that different electron bundles do not interact with each other.

Other embodiments according to the present invention are shown in FIGS. 8a to 8d. Therein, 4-fold symmetric aperture arrangements 86a to 86d are shown. This rotational symmetry by 90° has the advantage, that the resulting spherical aberrations can be corrected with an octupole element that may be present in typical charged particle beam inspection or testing devices. However, also an aperture arrangement with a 2-fold symmetry (as described in FIG. 3a) might be used and the aberrations introduced may also be easily corrected.

Figure 8A:
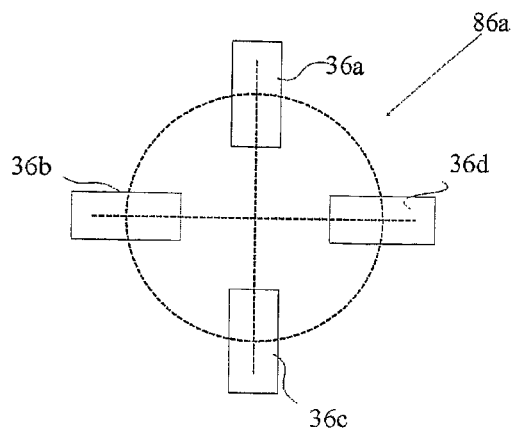
FIGS. 8a to 8d show schematic top views of further aperture arrangements according to the present invention.
Figure 8B:
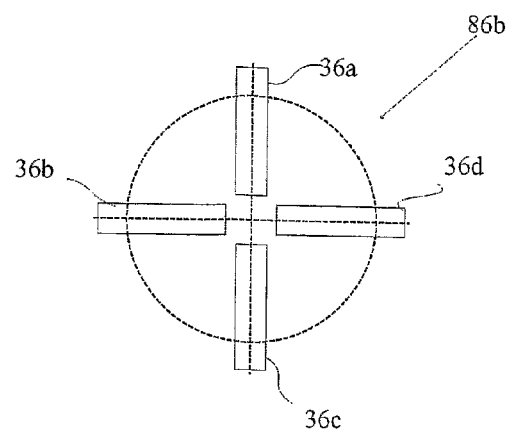

FIG. 8a shows an aperture arrangement with four apertures 36a to 36d. The apertures have rectangular shape. Typically the longer dimension of the aperture is radially orientated. Thereby, the introduced spherical aberrations have advantageously correctable spherical aberrations.

A further embodiment (see FIG. 8a) also has 4 apertures. However, the apertures do extend further towards an optical axis, which would be located essentially in the middle of the aperture arrangement 86b.

Figure 8C:
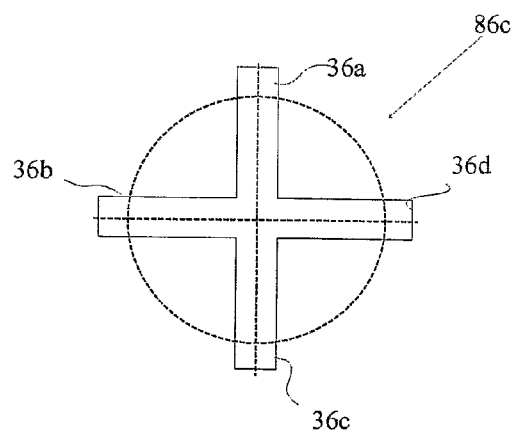

Within FIG. 8c, the apertures are further extended towards the center. Thereby a cross-shaped aperture is realized. Such an aperture arrangement does no longer form independent electron beams (bundles). However, the same inventive concept does still apply. The electron-electron-interaction is reduced since the ratio of the circumference of the aperture and the area of the aperture is increased as compared to a circular aperture. Electrons passing through the aperture at the ends of the four arms of the cross do not interact with electrons from a neighboring arm because of their distance.

The aperture of aperture arrangement 86c forms a multi-area sub beam electron beam. That is, there are sub-beams in multiple areas, which are, however, connected to form a single beam.

Figure 8D:
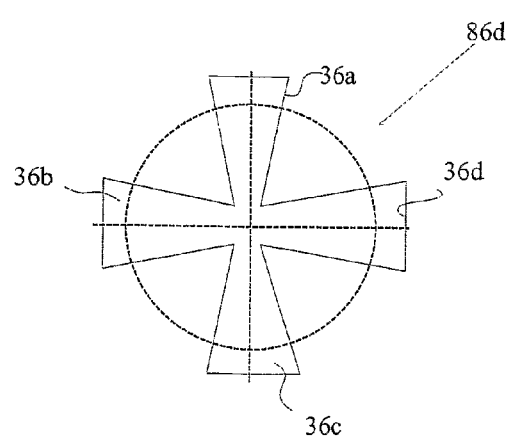

Since the distance between the arms (36a-36d) of the cross-shape increases with the distance from the center, it is also possible to realize a shape according to FIG. 8d. Therein, the arms of the cross get broader with the distance from the center of the cross-shaped aperture.

Another aspect of the present invention will now be described with reference to the embodiments shown in FIGS. 4a to 4d. As already mentioned with respect to FIG. 1c, the beam path along which electron-electron interaction can occur should be short. A position of the aperture arrangement closer to the emitter 12 results in a shorter beam path along which the electrons can interact, and a longer beam path along which the electron beams are separated. Therefore, it may be considered advantageous if any of the embodiments shown in FIGS. 4a to 4d are realized. Within FIG. 4a, the aperture arrangement 26 is directly positioned after anode 14. The term "directly positioned" should herein be understood as having no space-consuming components, like lenses or the like, between anode 14 and aperture-arrangement 26.

Figure 4A:
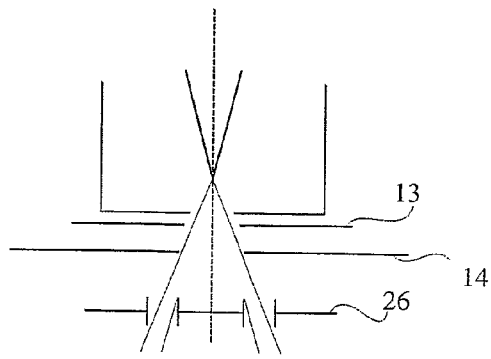
FIGS. 4a to 4d show schematic side views of embodiments relating to aperture arrangement positions within a charged particle beam device.
Figure 4B:
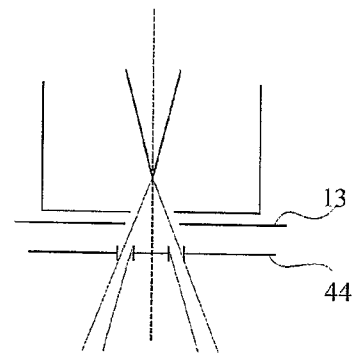
Figure 4C:
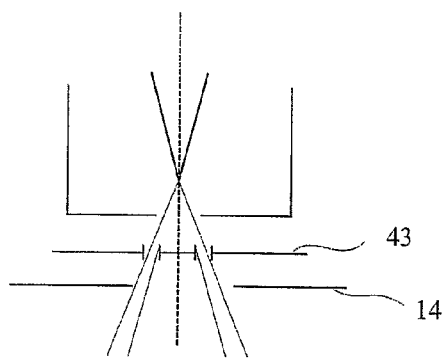

Within FIG. 4b, a separation of the electrons into independent electron beam bundles is realized even closer to the emitter as compared to FIG. 4a. Thereby, the anode is formed to incorporate the aperture arrangement 44 by having at least two openings. Within FIG. 4c, the extractor is formed to incorporate the aperture arrangement 43, whereby a separation of the electrons into independent electron beam bundles is realized still closer to the emitter.

As described above, on the one hand the aperture arrangement should be close to the emitter. On the other hand, the apertures should be within a homogeneous emission angle of the gun and the distance between the independent beam bundles should be sufficiently large. Thus, providing a characteristic emission angle of a certain gun, the aperture arrangement's distance from the emitter and the aperture distances can be optimized. Typical values are in the range of 10-1 rad for the emission angle (half angle) results for an aperture arrangement distant from the source or the virtual source in a 1 mm-radius illuminated circle. For a 1 mm distant aperture arrangement, the illuminated circle has a radius of 100 μm. Therein, apertures with a dimension of e.g. 10 μm can be positioned.

Figure 4D:
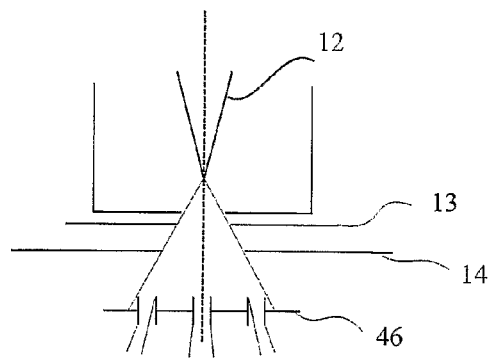

A further embodiment is shown in FIG. 4d. Within this embodiment, the aperture arrangement 26 of FIG. 4a has an additional opening. This opening is positioned such that the electron beam passing through this opening travels substantially along the optical axis. The on-axis opening of aperture arrangement 46 of FIG. 4d may for example be used for an additional measurement mode. Thereby, the electron beam column can be operated with an on-axis electron beam. This on-axis electron beam mode may be used for adjustment purposes or in the event low current measurements should be conducted.

Nevertheless, the on-axis electron beam bundle may also be used in combination with other electron beam bundles to realize a high current density measurement mode as long as electron beam bundle interaction is sufficiently small.

Figure 5:
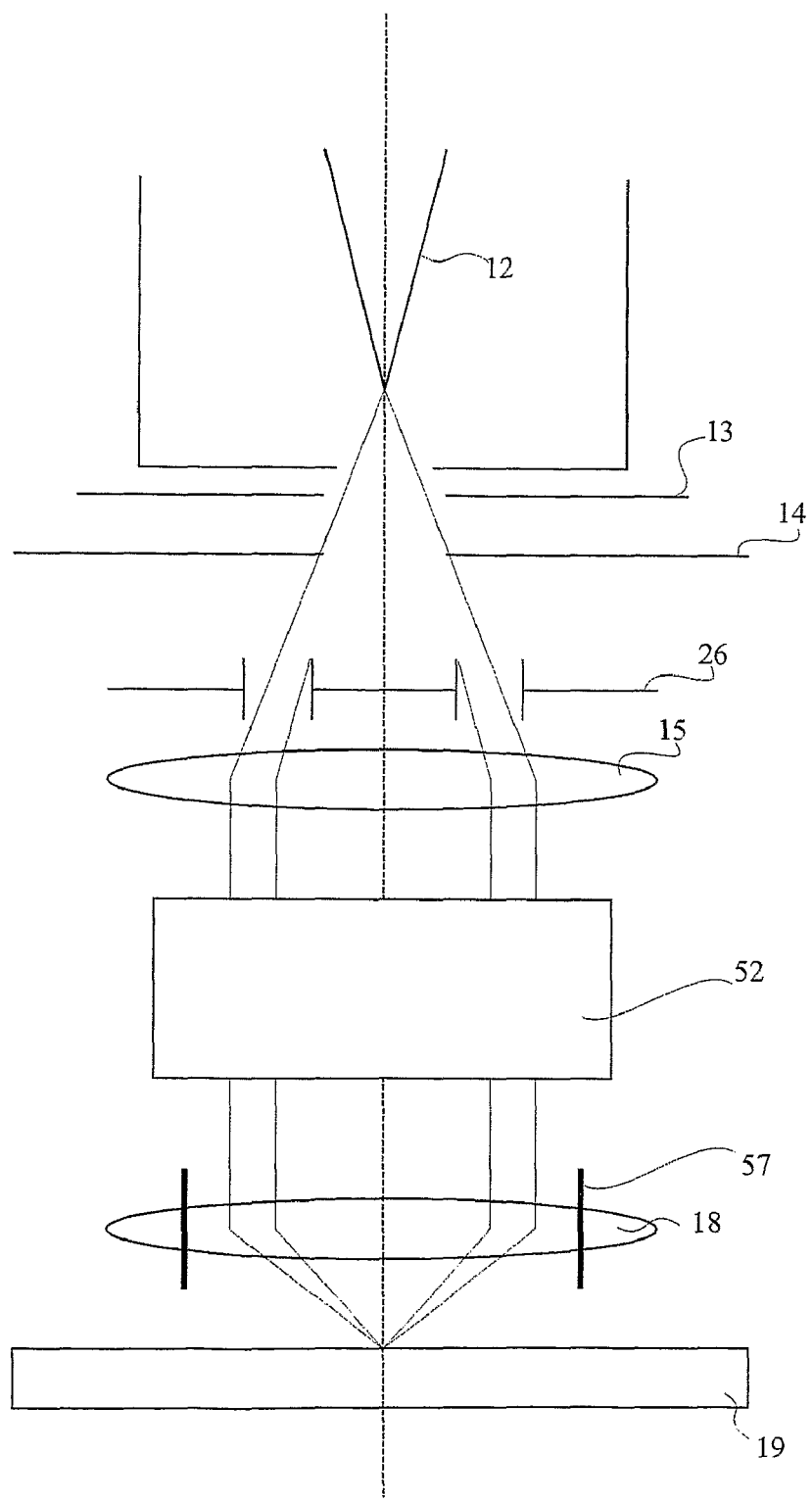
FIG. 5 shows a schematic side view of charged particle beam devices according to embodiments of the present invention, whereby an aberration correction element is included.

Within the embodiments shown in FIG. 5, a further optional feature is included. As described above, at least two independent electron beams (bundles) are separated such that no significant interaction may occur. Since each independent beam can be interaction optimized, the beam current density on the specimen can be increased n times for n electron beam bundles. Thereby, spherical aberrations are introduced because of the off-axis beam paths. Depending on the operation conditions, the spherical aberrations may be neglected or may not be neglected. For some applications, e.g. with very high current densities, the size limitation of the electron probe on the specimen will still be dominated by interaction effects. However, other applications may have operation conditions for which aberration limitations will have a significant effect on the resolution of the electron beam device.

In the event that spherical aberrations may not be neglected, a spherical aberration correction element 52 (see FIG. 5) can be included in the system. Within FIG. 5, the electrons emitted by emitter 12 pass through the same elements as described with respect to FIG. 2. After passing through condenser lens 15, the independent electron beams pass through correction element 52. Scanning deflector 57 is located below the correction element and may, for example, be positioned within the objective lens 18. The independent electron beam bundles are focused by objective lens 18 onto the same area of specimen 19. Thereby, one single electron probe is realized on the specimen.

The spherical aberration correction element 52 can for example be a sixtupole element as known from U.S. Pat. No. 4,414,474. However, according to one optional aspect of the present invention, other configurations can be used. For an aperture arrangement 26 having only four electron beam bundles, an octopole element can be used. Thereby, according to yet another optional aspect of the present invention, one single octopole element is sufficient for correcting the spherical aberrations of four electron beam bundles. Such a single element, which is commonly not used for spherical operation corrections, is easier to realize and is especially suitable for certain beam bundle arrangements. This will be described in more detail with respect to FIG. 6.

The spherical aberration correction element 52 can either be magnetic, electrostatic or combined electrostatic-magnetic. Within FIG. 6, an electrostatic correction element 52 with electrodes 62 is shown. This octopole correction element, that could as well be magnetic or electromagnetic, has a field distribution that matches especially well with the aperture arrangement 26 shown in FIG. 6.

The aperture arrangement 26 has four rectangular apertures, whereby the longer sides are radially orientated. The slit-like apertures result in electron beam bundle-shapes which can advantageously be corrected in two directions by a single octopole element.

Figure 6:
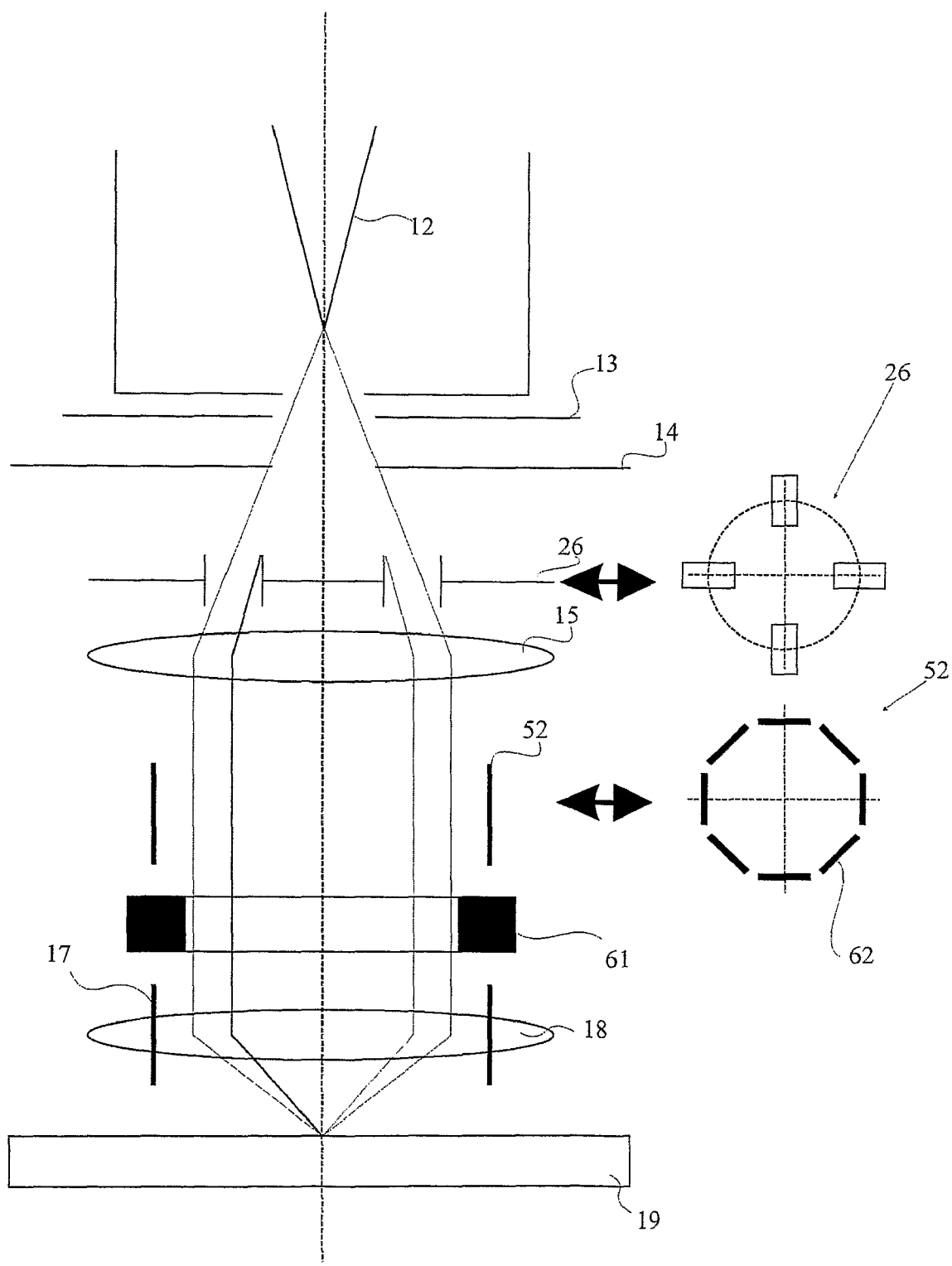
FIG. 6 shows a schematic side view of a charged particle beam device according to one embodiment of the present invention, whereby an aberration correction element and a detector are included.

Additionally to the components that have already been described with respect to other embodiments, FIG. 6 shows a detector 61. Within the present invention, the electron beam bundles of the primary electron beam travel independently of each other. Nevertheless, the independent electron beams meet in the same focus. Thus, it is possible to use conventional detection schemes. Within FIG. 6, a detector 61 in the form of a ring positioned above objective lens 18 is shown. Detector 61 collects backscattered electrons, secondary electrons, other charged particles, or photons released from specimen 19 on impingement of the primary electron beams.

Further detection schemes will next be described with respect to FIGS. 7*a* and 7*b*. FIG. 7*a* shows an electron beam column wherein the electrons pass substantially along a straight optical axis from the emitter to the specimen. Above the objective lens, a Wien filter element 73 is provided. The Wien filter element has, when excited, magnetic and electric fields such that primary electrons with a predetermined energy pass through the filter element 73 in an undisturbed manner. However, charged particles having a direction different from the primary electrons are deflected by the combination of the electric and magnetic field. As a result, secondary particles that are released from the specimen and that have passed from the specimen through the objective lens are deflected to detector 61*a*.

Figure 7B:
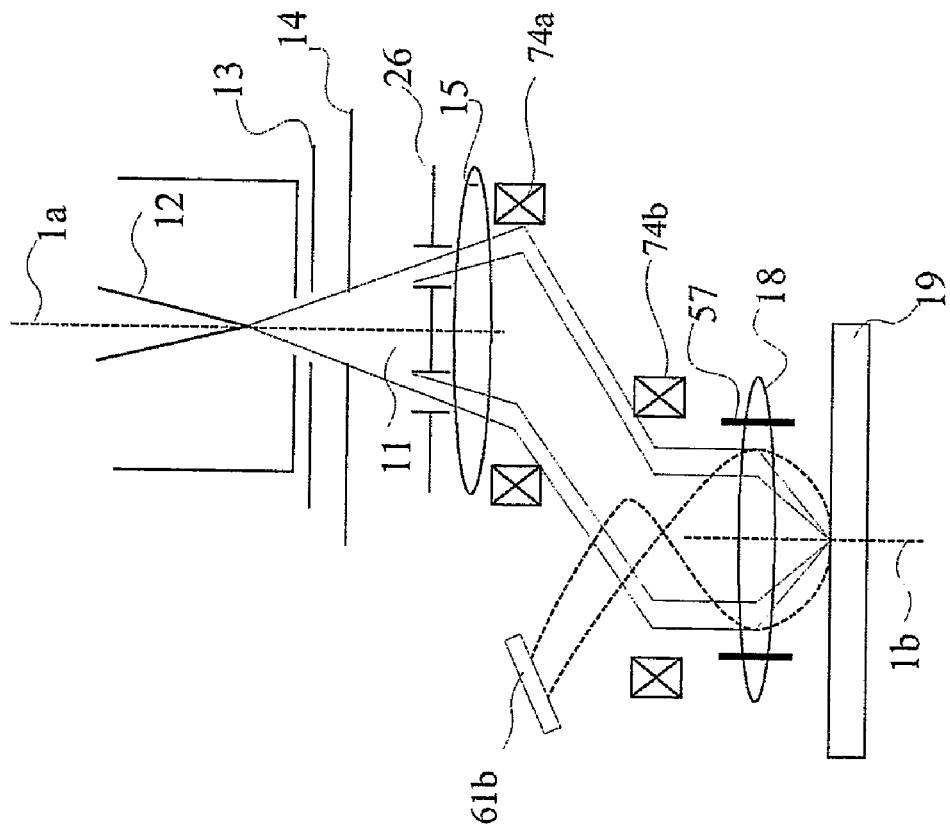
FIGS. 7a and 7b show schematic side views of a charged particle beam device, whereby possible detection schemes to be combined with embodiments of the present invention are illustrated.
Figure 7A:
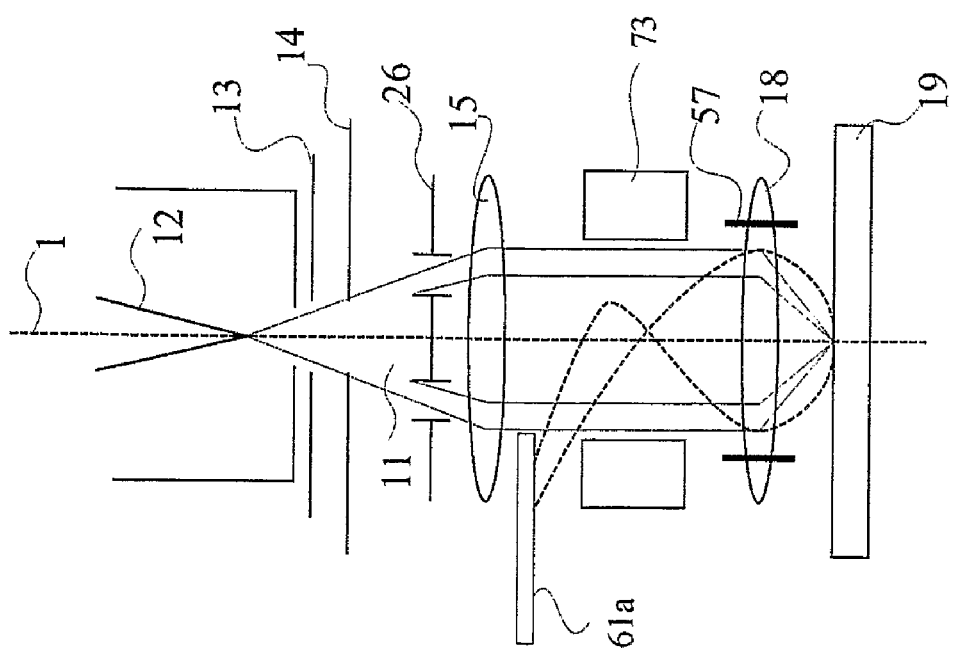

Another embodiment regarding a detection scheme is shown in FIG. 7*b*. Therein, two deflectors 74*a* and 74*b* are utilized. Without being limited thereto, the deflectors of this example are indicated as magnetic deflectors. Emitter 12 emits electron beam 11, which is extracted by extractor 13 and further shaped by anode 14. The independent electron beam bundles formed by aperture arrangement 26 are deflected in a first deflector 74*a* after passing through condenser lens 15. Thereby, the independent electron beams travel nonparallel to the first optical axis 1*a* and the second optical axis 1*b*. Second deflector 74*b* deflects the independent electron beams to travel substantially parallel to the second optical axis 1*b*. Thereafter, the independent electron beams are focused into a common electron probe by objective lens 18. Additionally, depending on the desired impingement location on the specimen, scanning deflector 57 can be used for scanning the independent electron beams over the specimen. The secondary and/or backscattered changed particles that have passed through the objective lens and travel upwardly in the electron beam column are deflected by second deflector 74*b*. Since the deflection of the magnetic deflector depends on the direction of the secondary and/or backscattered charged particles, these particles are deflected towards detector 61*b*.

As described with respect to the exemplary embodiments above, providing several independent electron beams having no beam-interaction can increase the beam current density on the specimen. Thereby, the interaction limitation of the resolution can be overcome. As described with respect to FIGS. 1*a* to 1*c*, other measures can also be used for reducing the interaction limitation. For all of the above-described embodiments, aspects and/or details, the features described with respect to FIG. 1*c* can be added individually or in any combination of these features. That is, one, two, three, four, or five measures can be arbitrarily chosen from the following group: the charged particles can be accelerated to higher energies, several columns can be arrayed, the column length can be reduced, each charged particle beam bundle can be interaction optimized, and charged particles, which are blocked for beam shaping reasons or the like within the charged particle column, are blocked as close to the emitter as possible, whereby a possible interaction between charged particles is reduced to a shorter path.

A further aspect will now be described with reference to FIG. 2. In view of the independent electron beams having distance D and, therefore, traveling off-axis, the defective aperture angle $\alpha_{obj}$ is relatively large as compared to systems with an on-axis electron beam. Thereby, the depth of focus is reduced. This effect may be used for the construction of 3-dimensional images. According to this aspect, the specimen area to be inspected is measured several times. Objective lens 18 is excited to have different focal length within the several measurements. Each of the different focal lengths refers to one focus layer. Thereby, a set of focus series measurements is obtained. These focus series measurements can be superposed. Thereby, a 3-dimensional image is obtained.

The invention claimed is:

1. A charged particle beam device, comprising:
an emitter for emitting charged particles;
an aperture arrangement with at least one aperture for blocking a part of the emitted charged particles, wherein the aperture arrangement forms a multi-area sub-beam charged particle beam with a cross-section-area and a cross-section-circumference, wherein a ratio between the cross-section-circumference and the cross-section-area is increased by at least 15% as compared to the ratio between a cross-section-circumference and a cross-section-area of a circular beam with the same cross-section-area as the multi-area sub-beam charged particle beam; and
an objective lens for focusing the multi-area sub-beam, wherein the charged particle beam device, including the emitter, the aperture arrangement, a condenser lens, and a scan deflector, is adapted to focus the multi-area sub-beam charged particle beam onto the same location within the focal plane for generating a probe on the specimen being an image of a source, a virtual source, or a crossover.

2. The device according to claim 1, wherein the ratio between the circumference of the cross-section and the cross-section-area is increased by at least 40% as compared to the ratio between the circumference of the cross-section and the cross-section-area of a circular beam with the same cross-section-area.

3. The device according to claim 1, wherein the aperture arrangement with at least one aperture comprises at least two apertures, wherein the multi-area sub-beam charged particle beam is provided as at least two independent charged particle beams.

4. The device according to claim 1, wherein the aperture arrangement with at least one aperture forms a multi-area sub-beam charged particle beam with cross-like shape.

5. A charged particle beam device, comprising:
an emitter for emitting charged particles;
an aperture arrangement with at least one aperture for blocking a part of the emitted charged particles, wherein the aperture arrangement forms a multi-area sub-beam charged particle beam with a cross-like shape; and
an objective lens for focusing the multi-area sub-beam charged particle beam with a cross-like shape, wherein the charged particle beam device, including the emitter, the aperture arrangement, a condenser lens, and a scan deflector, is adapted to focus the multi-area sub-beam same location within the focal plane for generating a probe on the specimen being an image of a source, a virtual source, or a crossover.

6. The device according to claim 5, wherein the multi-area sub-beam charged particle beam is provided with a 4-fold symmetry around an optical axis of the device.

7. The device according to claim 5, wherein the aperture arrangement with at least one aperture comprises at least two apertures, wherein the multi-area sub-beam charged particle beam is provided as at least two independent charged particle beams.

8. A charged particle beam device, comprising:
an emitter for emitting charged particles;
an aperture arrangement with at least one aperture for separating the emitted charged particles into at least two independent charged particle beams; and
an objective lens for focusing the at least two independent charged particle beams, wherein the charged particle beam device, including the emitter, the aperture arrangement, a condenser lens, and a scan deflector, is adapted to focus the at least two independent charged particle beams onto the same location within the focal plane for generating a probe on the specimen being an image of a source, a virtual source, or a crossover.

9. The device according to claim 8, wherein the aperture arrangement forms a multi-area sub-beam charged particle beam with a cross-like shape.

10. The device according to claim 8, wherein the emitter is a quasi spot-like emitter with a source diameter below 200 nm.

11. The device according to claim 8, wherein the at least two independent charged particle beams have a distance (D) with respect to each other such that no interaction occurs between the at least two independent charged particle beams.

12. The device according to claim 8, wherein the at least two independent charged particle beams have a distance (D) with respect to each other, wherein the distance has about the same dimension as the diameter of the at least two apertures.

13. The device according to claim 8, wherein the at least two apertures are formed by a segmented annular aperture.

14. The device according to claim 8, wherein the at least two apertures have an elongated shape with a long axis and short axis, wherein the long axis is arranged radially with respect to an optical axis of the charged particle beam device.

15. The device according to claim 8, wherein the at least two apertures are arranged rotational-symmetrical to an optical axis of the charged particle beam device.

16. The device according to claim 8, wherein the at least one aperture of the aperture arrangement has a 4-fold symmetry shape.

17. The device according to claim 8, wherein the at least one aperture of the aperture arrangement has a cross-like shape.

18. The device according to claim 8, wherein the at least one aperture of the aperture arrangement has a cross-like shape formed by four connected elongated apertures.

19. The device according to claim 8, wherein the aperture arrangement comprises four apertures.

20. The device according to claim 8, further comprising a spherical aberration correction element.

21. The device according to claim 20, wherein the spherical aberration correction element is provided by an octopole element.

22. The device according to claim 8, wherein the aperture arrangement is positioned between a source or virtual source and a charged particle beam lens positioned closest to the source.

23. The device according to claim 8, wherein the aperture arrangement is integrated in an anode or in an extractor.

24. The device according to claim 8, further comprising:
a charged particle column length below 300 mm;
an optical system including the objective lens, wherein the optical system is arranged such that no crossover is generated;
an accelerating means for increasing the charged particle energy while traveling through the charged particle device and a decelerating means for decreasing the charged particle energy for impingement on a specimen; or a control means for interaction optimizing the at least two independent charged particle beams.

25. Method of operating a charged particle beam device, comprising:

illuminating an aperture arrangement with at least one aperture for blocking a part of the emitted charged particles, wherein the aperture arrangement forms a multi-area sub-beam charged particle beam with a cross-section-area and a cross-section-circumference, wherein a ratio between the cross-section-circumference and the cross-section-area is increased by at least 15% as compared to the ratio between a cross-section-circumference and a cross-section-area of a circular beam with the same cross-section-area as the multi-area sub-beam charged particle beam; and focusing the multi-area sub-beam charged particle beam with an objective lens onto the same location of a specimen for generating a probe on the specimen being the image of a source, virtual source, or a crossover.

26. The method of operating a charged particle beam device according to claim 25, wherein the illuminating comprises:

generating at least two independent charged particle beams.

27. The method of operating a charged particle beam device according to claim 26, wherein the at least two independent charged particle beams are generated on a circle around an optical axis of the charged particle device.

28. The method of operating a charged particle beam device according to claim 26, wherein the at least two apertures are provided such that no significant interaction between the at least two independent charged particle beams occur.

29. The method of operating a charged particle beam device according to claim 25, wherein the aperture arrangement is illuminated such that the at least one aperture is homogeneously illuminated.

30. The method of operating a charged particle beam device according to claim 25, further comprising:

interaction-optimizing each of the at least two independent charged particle beams.

31. The method of operating a charged particle beam device according to claim 25, wherein the charged particles are energized to impinge on the specimen with an energy below 3 keV.

32. The method of operating a charged particle beam device according to claim 25, further comprising:

correcting spherical aberrations, which are introduced by guiding parts of the multi-area sub-beam charged particle beam off-axis.

33. The method of operating a charged particle beam device according to claim 25, further comprising:

detecting secondary and/or backscattered particles for imaging the specimen in a measurement; and repeating imaging steps several times to generate a set of focus series measurements; and generating a 3-dimensional image by superposing the set of focus series measurements.

34. The device according to claim 25, wherein the beam current is 50 nA or higher.

* * * * *

UNITED STATES PATENT AND TRADEMARK OFFICE
CERTIFICATE OF CORRECTION

PATENT NO. : 7,663,102 B2
APPLICATION NO. : 10/593246
DATED : February 16, 2010
INVENTOR(S) : Frosien It is certified that error appears in the above-identified patent and that said Letters Patent is hereby corrected as shown below:

In Detailed Description of the Drawings:

Column 6, Line 47, please delete "$D_{probe}=(D^2_{sperical}+D^2_{chromatic}+D^2_{interaction})^{1/2}$" and insert --$D_{probe}=(D^2_{spherical}+D^2_{chromatic}+D^2_{interaction})^{1/2}$-- therefor;

Column 6, Line 50, please delete "$D_{special}=C_{s\alpha}{}^3$" and insert --$D_{spherical}=C_s\alpha^3$-- therefor;

Column 6, Line 56, please delete "$D_{sperical\ enlargement}=3C_s\alpha_B\alpha^2$" and insert --$D_{spherical\ enlargement}=3C_s\alpha_B\alpha^2$-- therefor;

Column 10, Line 35, please delete "changed" and insert --charged-- therefor;

In the Claims:

Column 11, Claim 5, Line 56, insert --the-- before same.

Signed and Sealed this

Eighth Day of June, 2010

David J. Kappos
*Director of the United States Patent and Trademark Office*